United States Patent
Tran et al.

(10) Patent No.: US 6,791,874 B2
(45) Date of Patent: Sep. 14, 2004

(54) MEMORY DEVICE CAPABLE OF CALIBRATION AND CALIBRATION METHODS THEREFOR

(75) Inventors: Lung T. Tran, Saratoga, CA (US); Manoj K. Bhattacharyya, Cupertin, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/753,298

(22) Filed: Jan. 8, 2004

(65) Prior Publication Data

US 2004/0141370 A1 Jul. 22, 2004

Related U.S. Application Data

(62) Division of application No. 10/232,363, filed on Sep. 3, 2002.

(51) Int. Cl.[7] .............................................. G11C 11/00
(52) U.S. Cl. ........................ 365/158; 365/211; 365/242
(58) Field of Search ............................... 365/158, 211, 365/242

(56) References Cited

U.S. PATENT DOCUMENTS

| | | | | |
|---|---|---|---|---|
| 5,841,692 A | * | 11/1998 | Gallagher et al. | 365/173 |
| 6,577,549 B1 | * | 6/2003 | Tran et al. | 365/211 |
| 6,608,790 B2 | * | 8/2003 | Tran et al. | 365/211 |

* cited by examiner

*Primary Examiner*—Van Thu Nguyen
*Assistant Examiner*—Tuan T. Nguyen (57) ABSTRACT

A memory device having a cross point array of memory cells includes a temperature sensor and a reference memory cell. The temperature sensor senses the temperature of the memory device and data from the temperature sensor and the reference memory cell are used to update write currents used to program the array of memory cells. A method of calibrating the memory device involves detecting a temperature of the memory device, determining whether the temperature of the memory device has changed by a threshold value, and updating write current values if the temperature of the memory device changes by the threshold value. The write current values can be updated by data from the reference memory cell, or from write current values stored in a lookup table.

14 Claims, 8 Drawing Sheets

MEMORY DEVICE CAPABLE OF CALIBRATION AND CALIBRATION METHODS THEREFOR

This application is a division of application Ser. No. 10/232,363, filed Sep. 3, 2002.

TECHNICAL FIELD

The technical field relates to memory devices capable of calibrating write currents in order to compensate for temperature variations.

BACKGROUND

Figure 1:
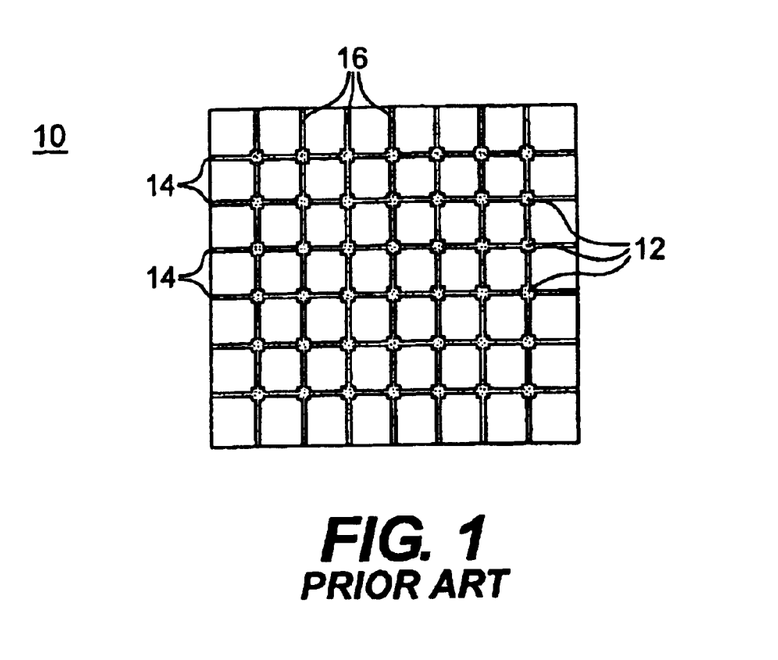
FIG. 1 illustrates a conventional memory array.

Magnetic Random Access Memory (MRAM) is a proposed type of non-volatile memory. MRAM devices allow faster data access than conventional storage devices such as hard drives. FIG. 1 illustrates a conventional MRAM memory array 10 having resistive memory cells 12 located at cross points of row conductors 14 and column conductors 16. Each memory cell 12 is capable of storing the binary states of "1" and "0."

Figure 2:
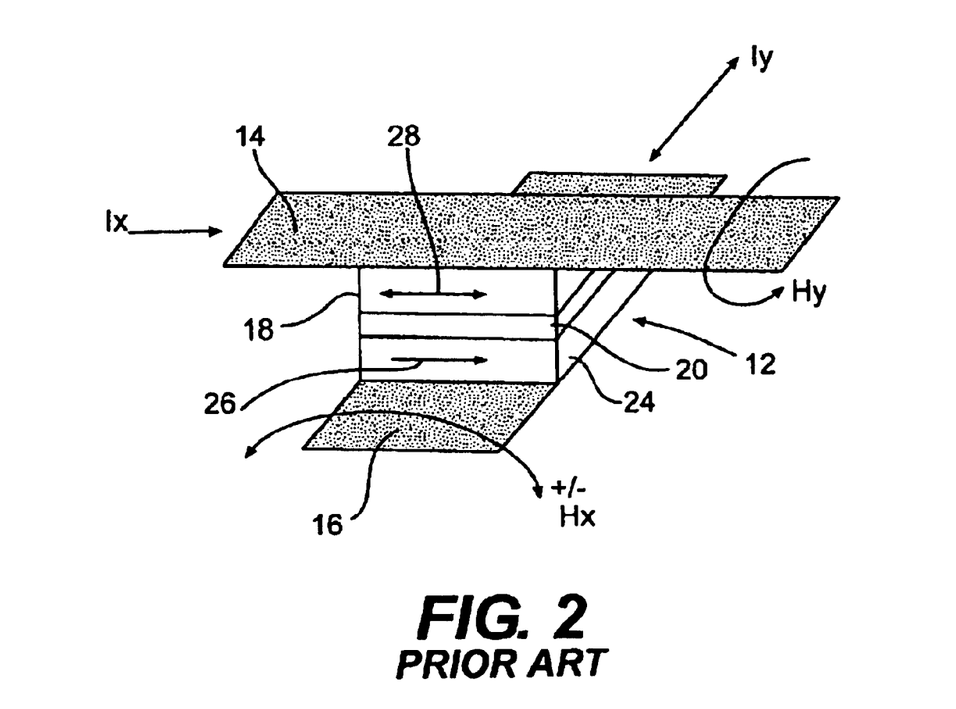
FIG. 2 illustrates binary states of a conventional memory cell.

FIG. 2 illustrates a conventional MRAM memory cell 12. The memory cell 12 includes a pinned layer 24 and a free layer 18. The pinned layer 24 has a magnetization of fixed orientation, illustrated by the arrow 26. The magnetization of the free layer 18, illustrated by the bi-directional arrow 28, can be oriented in either of two directions along an "easy axis" of the free layer 18. The magnetizations of the free layer 18 and the pinned layer 24 can be either "parallel" or "antiparallel" to one another. The two orientations correspond to the binary states of "1" and "0," respectively. The free layer 18 and the pinned layer 24 are separated by an insulating tunnel barrier layer 20. The insulating tunnel barrier layer 20 allows quantum mechanical tunneling to occur between the free layer 18 and the pinned layer 24. The tunneling is electron spin dependent, making the resistance of the memory cell 12 a function of the relative orientations of the magnetizations of the free layer 18 and the pinned layer 24.

Each memory cell 12 in the memory array 10 can have its binary state changed by a write operation. Write currents Ix and Iy supplied to the row conductor 14 and the column conductor 16 crossing at a selected memory cell 12 switch the magnetization of the free layer 18 between parallel and antiparallel with the pinned layer 24. The current Iy passing through the column conductor 16 results in the magnetic field Hx, and the current Ix passing through the row conductor 14 results in the magnetic field Hy. The fields Hx and Hy combine to switch the magnetic orientation of the memory cell 12 from parallel-to-antiparallel. A current $-$Iy is applied along with the current Ix to switch the memory cell 12 back to parallel.

In order to switch the state of the memory cell 12 from parallel-to-antiparallel, and vice versa, the combined field resulting from $+/-$ Hx and Hy exceeds a critical switching field Hc of the memory cell 12. If Hx and Hy are too small, they will not switch the orientation of the selected memory cell 12. If either Hx or Hy is too large, memory cells 12 on the row conductor 14 or the column conductor 16 of the selected memory cell 12 may be switched by the action of either Hx or Hy acting alone. Memory cells 12 subjected to either Hx or Hy alone are referred to as "half-selected" memory cells.

A problem may arise in MRAM arrays because the operational modes of an MRAM array and operating ambient temperature changes may cause the temperature of the MRAM array to vary, which would cause the coercivities of the memory cells to change. A change in coercivity of the memory cells changes the critical switching field Hc, which in turn changes the fields Hx and Hy required to switch the state of the cells. Temperature-dependent changes in critical switching field Hc increase the likelihood that an entire row or column of half-selected memory cells will be programmed due to the action of Ix or Iy alone, or, the likelihood that the write currents Ix and Iy acting together will be insufficient to switch a selected memory cell.

SUMMARY

According to a first embodiment, a memory device comprises a substrate, an array of memory cells disposed over the substrate, a plurality of first conductors, a plurality of second conductors, wherein the first conductors cross the second conductors at the memory cells, a first current source selectively coupled to the first conductors and capable of providing a first write current to selected first conductors, a second current source selectively coupled to the second conductors and capable of providing a second write current to selected second conductors, a controller for controlling the application of the first and second write currents to the array of memory cells, and a temperature sensor disposed in the memory device. The temperature sensor senses a temperature of the memory device, and data from the temperature sensor are used to update the first and second write currents according to the sensed temperature.

According to a second embodiment, a method of calibrating a memory device comprises detecting a temperature of the memory device, determining whether the temperature of the memory device has changed by a threshold value, and updating at least one write current value if the temperature of the memory device changes by the threshold value.

According to a third embodiment, a method of filling a table with write current values for use in a memory device comprises applying a first write current and a second write current to conductors crossing at a reference memory cell when the memory array is at a temperature, detecting a state of the reference memory cell, increasing the first write current and the second write current if the state of the reference memory cell does not change, repeating the above steps until the state of the reference memory cell changes from a first state to a second state, and storing the first write current value and the second write current value that cause the state of the reference memory cell to change, wherein the first and second write current values are associated with the temperature.

Other aspects and advantages will become apparent from the following detailed description, taken in conjunction with the accompanying figures.

DESCRIPTION OF THE DRAWINGS

The detailed description will refer to the following drawings, in which like numerals refer to like elements, and in which.

DETAILED DESCRIPTION

A memory device capable of calibration to compensate for temperature variations and a calibration method will be discussed by way of preferred embodiments and by way of the figures.

Figure 3:
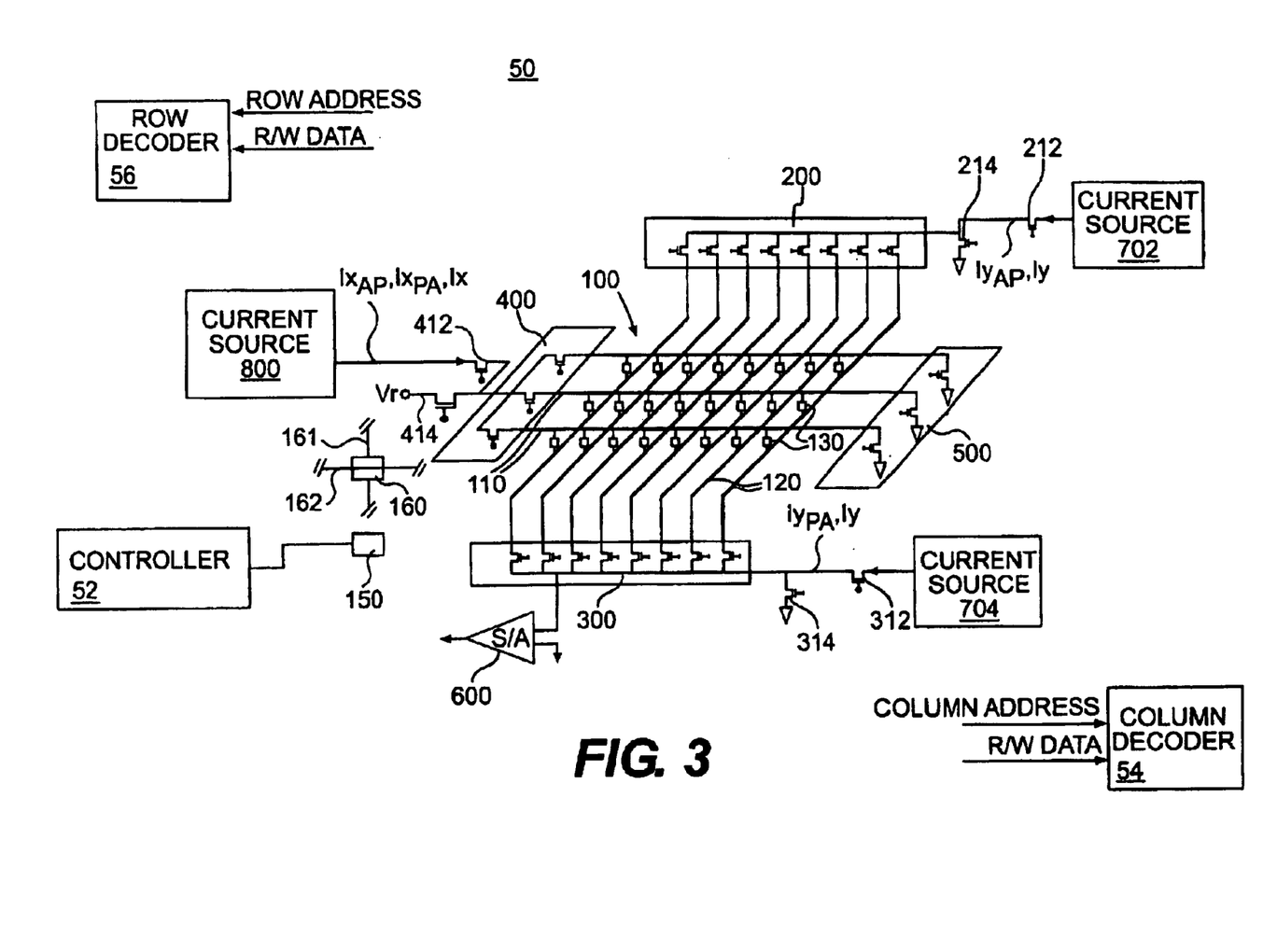
FIG. 3 is a schematic view of an embodiment of a memory device.

FIG. 3 is a schematic view of a cross point memory device 50 according to one embodiment. The memory device 50 includes a controller 52, a column decoder 54, a row decoder 56, a memory array 100, a bank 200 of write select switches, a bank 300 of read/write select switches, a bank 400 of read/write select switches, a bank 500 of write termination select switches, a sense amplifier 600, and current sources 702, 704, 800. The memory device 50 also includes a temperature sensor 150 and a reference memory cell 160 used to calibrate the memory device 50.

The controller 52 controls read and write operations of the memory device 50. The controller 52 is coupled to the row decoder 56 to transmit commands to the row decoder 56, including read/write (R/W) data and row address data The row decoder 56 is coupled to the gates of the switches in the switch banks 400 and 500, and opens and closes the switches in accordance with the controller 52 instructions. Similarly, the controller 52 is coupled to the column decoder 54, which is coupled to the gates of the switches in the switch banks 200, 300. The switches of the memory device 50 are illustrated as transistors. However, switches such as, for example, FET or MOSFET switches, and other switches, can also be used. The controller 52 can also be coupled to the temperature sensor 150 and the reference memory cell 160 to control calibration of the memory device 50.

The memory array 100 stores data for the memory device 50. In the memory array 100, row conductors 110 extend in horizontal rows, and column conductors 120 extend in vertical columns. The row conductors 110 cross the column conductors 120 at memory cells 130. Each memory cell 130 can store the binary states 1 and 0. In FIG. 3, three rows of row conductors 110 and eight columns of column conductors 120, intersecting at twenty-four memory cells 130, are shown for the purposes of illustration. In practice, arrays of 1024×1024 or more memory cells may be used.

The bank 200 of write select switches selectively couples the column conductors 120 to column write currents $IY_{AP}$ or Iy from the current source 702, or to ground via a switch 214. A switch 212 selectively couples the column write current source 702 to the bank 200 of write select switches. The bank 300 of read/write select switches selectively couples the column conductors 120 to column write currents $Iy_{PA}$ or Iy from the current source 704, or to ground via a switch 314. The bank 300 also selectively couples the column conductors 120 to the sense amplifier 600. The bank 400 of read/write select switches selectively couples the row conductors 110 to a read voltage Vr through a switch 414, and to row write currents $Ix_{AP}$, $Ix_{PA}$ or Ix via a switch 412. The bank 500 of write termination select switches selectively couples the row conductors 110 to ground. The current source 800 coupled to the bank 400 serves as a row write current source.

Writing to, or "programming" the memory cells 130 will now be discussed. In the discussion below, the subscript "PA" indicates programming a memory cell 130 from parallel-to-antiparallel, and the subscript "AP" indicates programming a memory cell 130 from antiparallel-to-parallel. In order to write a state of 1, or an antiparallel state, to a memory cell 130 in the memory array 100, the column write current $Iy_{PA}$ is supplied to the column conductor 120 of the column in which the selected memory cell 130 is located, from the current source 702. The row write current $Ix_{PA}$ is simultaneously supplied to the row conductor 110 of the row in which the selected memory cell 130 is located. The banks 500 and 300 connect the respective currents conductors 110, 120 to ground. The magnetic fields Hy and Hx generated by the write currents $Ix_{PA}$ and $Iy_{PA}$ combine to change the binary state of the memory cell 130 from 0 to 1. To write a bit of 0 to a memory cell 130, the row write current $Ix_{AP}$ is applied as above, and the column write current $Iy_{AP}$ is applied from the current source 704. The bank 200 connects the current $Iy_{AP}$ to ground.

According to methods of programming discussed above, the column write currents $Iy_{AP}$ and $Iy_{PA}$ used to program a memory cell 130 can be of differing magnitude. The row write currents $Ix_{AP}$ and $Ix_{PA}$ can also have different magnitudes.

The memory device 50 can also operate using a single Ix value and a single Iy value for parallel-to-antiparallel and antiparallel-to-parallel programming. In this case, to write a bit of 1 to a memory cell 130, Iy is applied from the current source 702, and Ix is applied from the current source 800. To write a bit of 0, Iy is applied from the current source 704, and Ix is applied from the current source 800. Iy supplied from the current source 704 may be referred to as "–Iy".

During operation of the memory device 50, read and write operations generate heat in the memory array 100. In addition, support circuitries in the memory device 50 generate heat. These factors, along with the changing ambient temperature of the operating environment, and other factors, may cause the temperature of the memory device 50 to vary. The changing temperature causes the coercivities, and therefore the critical switching fields Hc of the memory cells 130, to vary during operation of the device 50.

In order to compensate for changes in memory cell critical switching field Hc, the memory device 50 includes the temperature sensor 150 and the reference memory cell 160. The controller 52 may be coupled to the temperature sensor 150 to accept temperature data from the temperature sensor 150. The controller 52 can use data from the temperature sensor 150 and the reference memory cell 160 to calibrate the write currents $Iy_{AP}$, $Iy_{PA}$, $Ix_{AP}$ and $Ix_{PA}$, or Ix and Iy as the temperature of the array 100 varies. The temperature sensor 150 can be located anywhere in the memory device 50 where the temperature of the memory cells 130 can be detected. In one embodiment, the temperature sensor 150 is located beneath the memory array 100. For example, the memory device 50 can comprise a semiconductor substrate (not illustrated), and the temperature sensor 150 can be disposed over the substrate in the vicinity of the memory cells 130, or in other locations. The temperature of the array 100 may be relatively uniform across the array 100, and it may therefore not be necessary to place the temperature sensor 150 in close proximity to the memory cells 130. Multiple temperature sensors 150 can also be used, with sensors 150 located in multiple locations in the memory device 50. If multiple temperature sensors 150 are used, the controller 52 can, for example, utilize an average of temperature readings from the sensors 150.

The reference memory cell 160 can also be at any location in the memory device 50. The reference memory cell 160 may be located at the cross point of a first conductor 161 and a second conductor 162. The first conductor 161 can be coupled to the banks 200 and 300 of switches, and the second conductor 162 can be coupled to the banks 400 and 500 of switches. By these connections, the state of the reference memory cell 160 can be changed by the action of $Iy_{AP}$, $Iy_{PA}$, $Ix_{AP}$ and $Ix_{PA}$, or Ix and Iy in the same manner that the memory cells 130 are programmed. The reference memory cell 160 can also be connected to a read voltage Vr through the bank 400 of read/write select switches, and to the sense amplifier 600 through the bank 300 of read/write select switches. The controller 52 can therefore detect the state of the reference memory cell 160 from the output of the sense amplifier 600.

Figure 4:
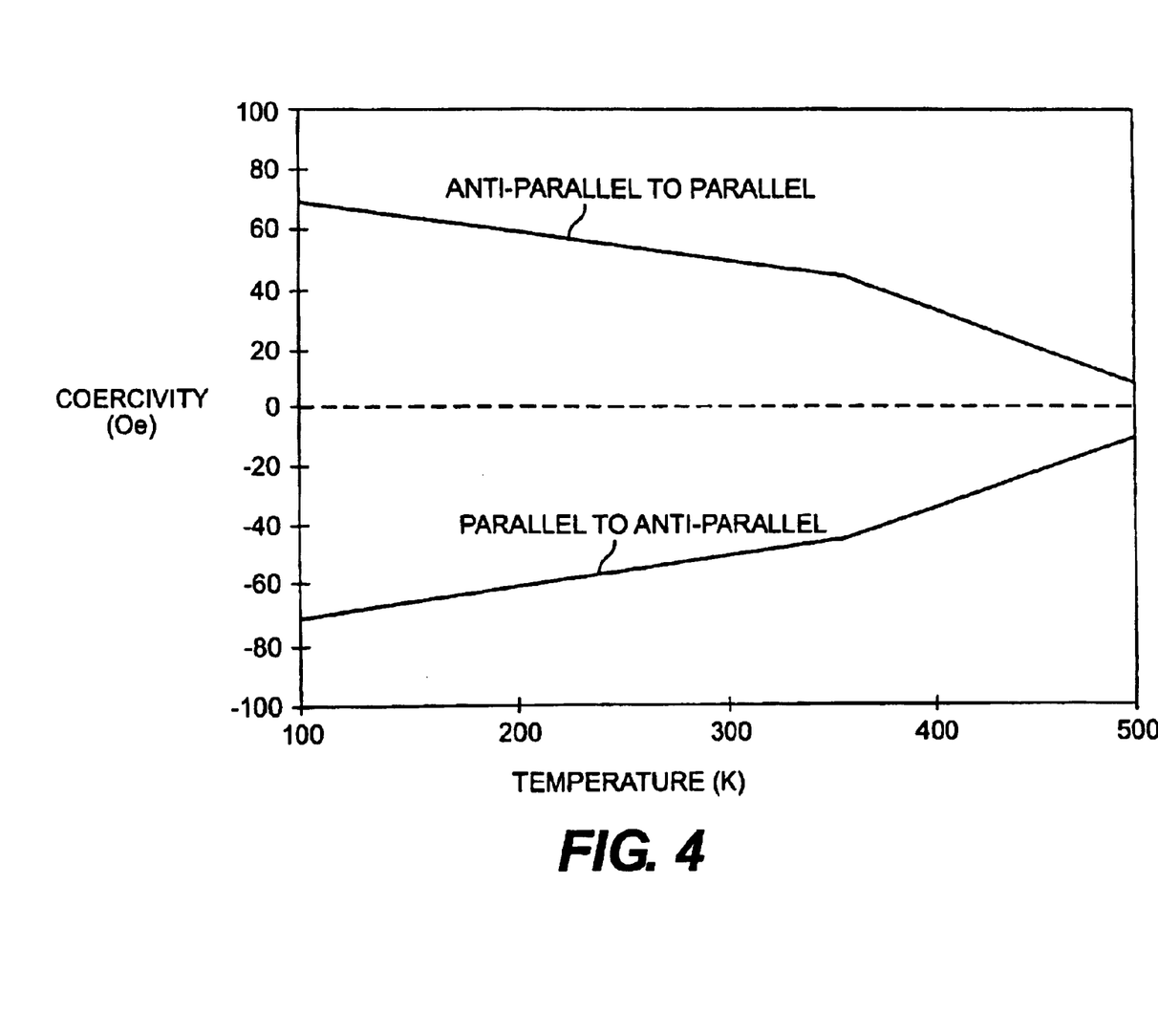
FIG. 4 is a plot of coercivity, or critical switching current, versus temperature for a memory cell.

Operation of the reference memory cell 160 and the temperature sensor 150 is discussed in further detail below. FIG. 4 illustrates coercivity characteristics of the memory cells 130 that render calibration using the memory cell 160 and the temperature sensor 150 advantageous.

FIG. 4 is a plot of coercivity (Oe), or critical switching field Hc, versus temperature for a memory cell 130. The critical switching field Hc for switching a memory cell 130 from antiparallel-to-parallel decreases with increasing temperature. The critical switching field Hc for switching a memory cell 130 from parallel-to-antiparallel increases with increasing temperature. In both cases, the magnitude of Hc decreases with increasing temperature. During operations of the memory device 50, such as when the device is in, for example, a standby mode or a read mode, the temperature of the memory array 100 may be different from when the memory device is in a write mode. The temperature of the memory array 100 may also vary while the array is in any of the above modes. The temperature variations in the memory array 100 therefore change the required magnitudes of the write currents $Iy_{PA}$ and $Ix_{PA}$, or $Iy_{AP}$ and $Ix_{AP}$. The switching data in FIG. 4 illustrate that the coercivity curves for switching a memory cell 130 from antiparallel-to-parallel and vice versa can be nonlinear. In addition, the antiparallel-to-parallel switching curve may also be asymmetric about the zero coercivity axis with respect to the parallel-to-antiparallel switching curve. If the switching curves are asymmetric, $Iy_{PA}$ and $Ix_{PA}$ for parallel-to-antiparallel switching at temperature T will differ in magnitude from $Iy_{AP}$ and $Ix_{AP}$ for antiparallel-to-parallel switching at the same temperature T.

Figure 5:
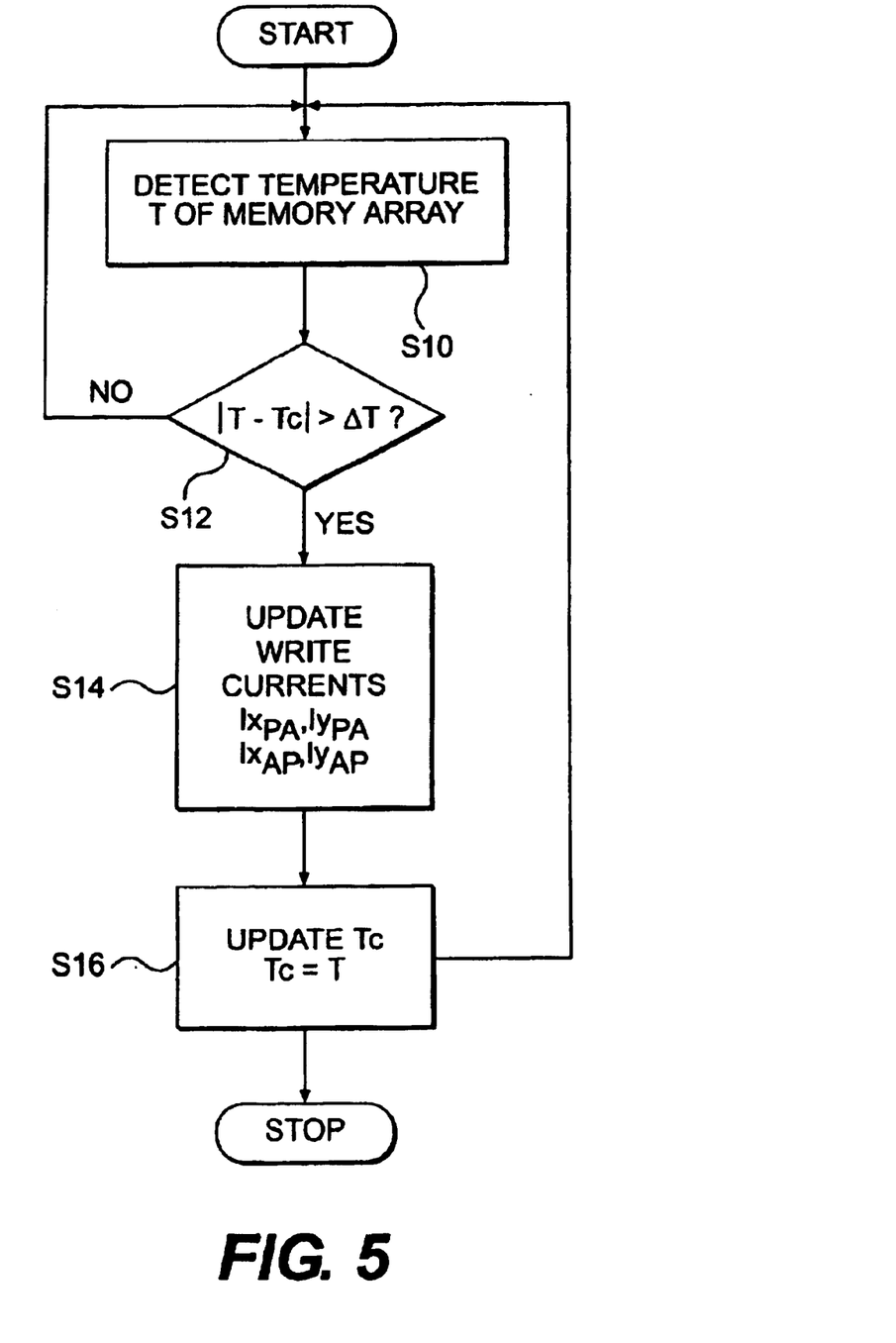
FIG. 5 is a flow chart illustrating a method of calibrating a memory device.

FIG. 5 is a flow chart illustrating a method of calibrating a memory device to compensate for temperature variations in the memory device. The method can be used, for example, to calibrate the memory device 50 illustrated in FIG. 3, or to calibrate other cross point memory devices. The calibration method can be used to calibrate the write currents $Ix_{PA}$, $Iy_{PA}$, $Ix_{AP}$, $Iy_{AP}$, and can be executed by the controller 52 of the memory device 50.

In step S10, a temperature T of the memory array 100 is detected by the temperature sensor 150. Temperature detection can be performed, for example, periodically.

In step S12, the temperature T of the memory array 100 is compared with a calibration temperature Tc to determine whether the difference between the temperature T of the memory array 100 and the calibration temperature Tc is greater than a threshold temperature change value ΔT. Step S12 is executed to determine whether the temperature T of the memory array 100 has risen or fallen a sufficient amount to change the coercivities of the memory cells 130 sufficiently to require an update of the write currents $Ix_{PA}$, $Iy_{PA}$, $Ix_{AP}$, $Iy_{AP}$ used to write to the memory cells 130. The calibration temperature Tc can be set as an initial reference value when the memory device 50 is activated When the memory device 50 is activated, the write currents $Ix_{PA}$, $Iy_{PA}$, $Ix_{AP}$, $Iy_{AP}$ may be selected to be appropriate to write to the memory cells 130 at the initial calibration temperature Tc. A suitable initial value for Tc can be, for example, room temperature.

If |T−Tc| does not exceed the threshold temperature change value ΔT, the method returns to step S10. The threshold temperature change value ΔT can be selected, for example, so that relatively small changes in the temperature T of the memory array 100 do not result in updating of the write currents $Ix_{PA}$, $IY_{PA}$, $Ix_{AP}$, $Iy_{AP}$. Step S18 can be performed, for example, periodically, according to any desired degree of accuracy for the calibration process.

Figure 6:
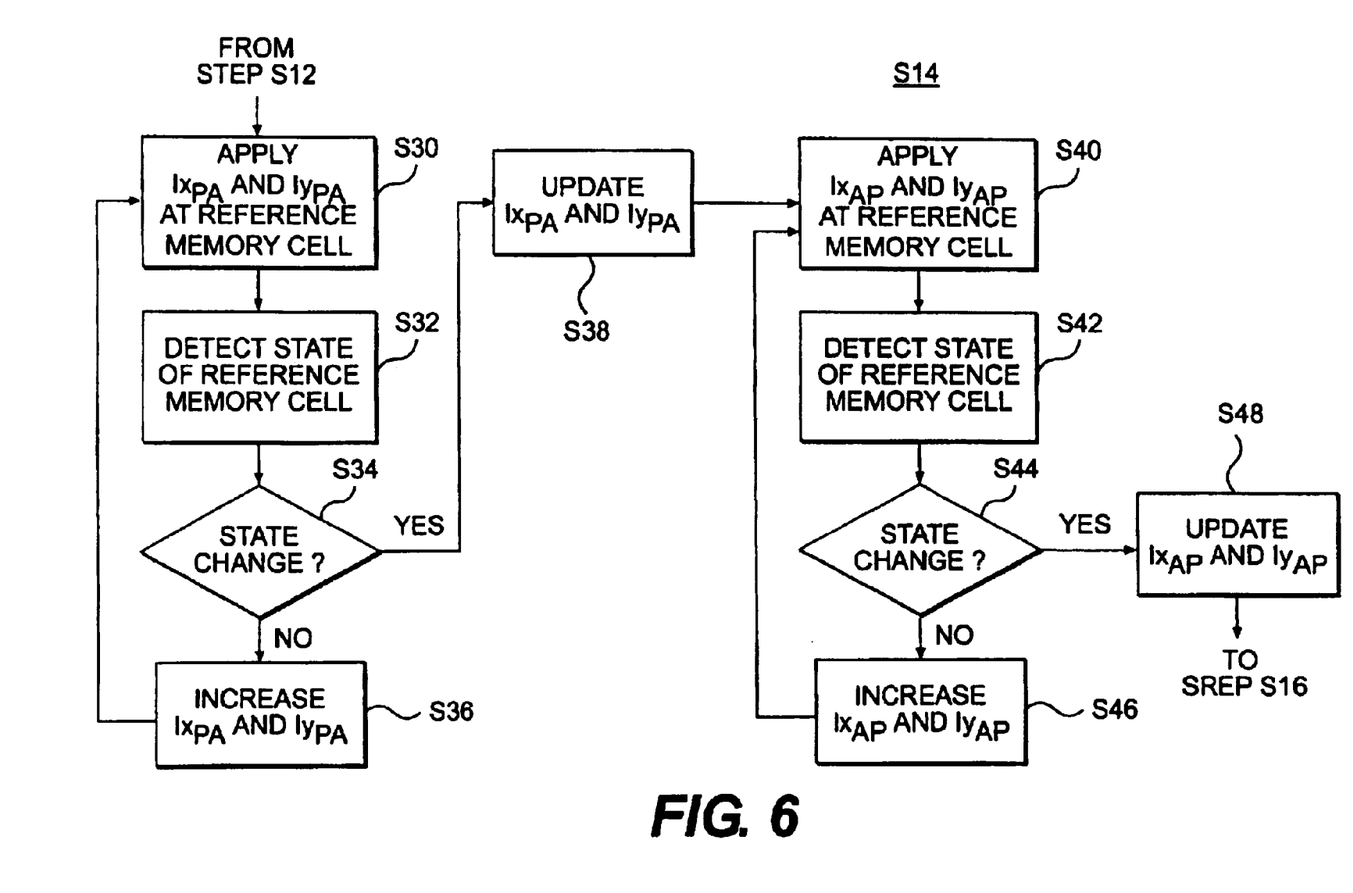
FIG. 6 is a flow chart illustrating a method of updating write currents according to the method illustrated in FIG. 5.

If |T−Tc| exceeds the threshold temperature change valued ΔT, the method proceeds to step S14. In step S14, the write currents $Ix_{PA}$, $Iy_{PA}$, $Ix_{AP}$, $Iy_{AP}$ are updated to compensate for coercivity changes in the memory cells 130 caused by the change in temperature T of the memory array 100. The write Currents $Ix_{PA}$, $Iy_{PA}$, $Ix_{AP}$, $Iy_{AP}$ can be updated according to the method illustrated in FIG. 6, in which data from the reference memory cell 160 are used to determine the appropriate $Iv_{PA}$, $Iy_{PA}$, $Ix_{AP}$, $Iy_{AP}$ values for the detected temperature T. The method illustrated in FIG. 6 is discussed in detail below. Alternatively, the appropriate $Ix_{PA}$, $Iy_{PA}$, $Ix_{AP}$, $Iy_{AP}$ values associated with the detected temperature T can be selected from a lookup table. The lookup table can include, for example, $Ix_{PA}$, $Iy_{PA}$, $Ix_{AP}$, $Iv_{AP}$ values for each of the temperature T values that the memory array 100 may be expected to have during operation. A method of filling a lookup table with $Ix_{PA}$, $Iy_{PA}$, $Ix_{AP}$, $Iy_{AP}$ values associated with particular calibration temperature values Tc is discussed in detail below with reference to FIG. 7.

After the $Ix_{PA}$, $Iy_{PA}$, $Ix_{AP}$, $Iy_{AP}$ values are updated in step S14, the calibration temperature Tc is updated in step S16. The calibration temperature Tc can be assigned the value of the present temperature T of the memory array 100 detected in step S10. The method then returns to step S10, where the temperature of the memory array 100 may be periodically monitored. Alternatively, the method can STOP when operation of the memory device 50 ceases.

According to the above method, at any time during operation of the memory device 50, appropriate $Ix_{PA}$, $Iy_{PA}$, $Ix_{AP}$, $Iy_{AP}$, values are available to write to a selected memory cell 130.

FIG. 6 is a flow chart illustrating a method of updating write currents according to a first embodiment. The steps illustrated in FIG. 6 comprise step S14 from FIG. 5. The method illustrated in FIG. 6 utilizes data from the reference memory cell 160 to determine appropriate $Ix_{PA}$, $Iy_{PA}$, $Ix_{AP}$, $Iy_{AP}$ values for the memory array 100 operating at a detected temperature T.

The method of updating write currents illustrated in FIG. 6 assumes that the antiparallel-to-parallel switching (coercivity) curve may be asymmetric about the zero coercivity axis with respect to the parallel-to-antiparallel switching curve. If the switching curves are asymmetric, appropriate $Ix_{PA}$ and $Iy_{PA}$ (currents used for parallel-to-antiparallel switching) for a temperature T will differ from $Ix_{AP}$ and $Iy_{AP}$ (currents used for antiparallel-to-parallel switching) for the same temperature T.

The method begins with a determination of $Ix_{PA}$ and $Iy_{PA}$. In step S30, arbitrarily low initial currents of $Ix_{PA}$ and $Iy_{PA}$ are applied at the first and second conductors 161, 162 crossing at the reference memory cell 160. The initial currents $Ix_{PA}$ and $Iy_{PA}$ should be small enough such that the reference memory cell 160 would not be expected to switch from parallel-to-antiparallel due to application of $Ix_{PA}$ and $Iy_{PA}$. In step S32, the state of the reference memory cell 160 is detected. The state of the reference memory cell 160 can be detected by applying a read voltage Vr to the second conductor 162 and connecting the first conductor 161 to the sense amplifier 600. The output of the sense amplifier 600 can be used to determine the state of the reference memory cell 160.

In step S34, it is determined whether the currents $Ix_{PA}$ and $Iy_{PA}$ caused the reference memory cell 160 to switch from a parallel to an antiparallel state. If the state of the reference memory cell 160 has not changed, $Ix_{PA}$ and $Iy_{PA}$ are increased by an incremental amount in step S36. The amount by which $Ix_{PA}$ and $Iy_{PA}$ are increased can be determined according to the degree of accuracy desired for the calibration process. The method then returns to step S30, where the increased currents $Ix_{PA}$ and $Iy_{PA}$ are applied to the reference memory cell 160. The process of incrementally increasing $Ix_{PA}$ and $Iy_{PA}$ is repeated until the state of the reference memory cell 160 changes. Then, at step S34, when a state change is detected, the method proceeds to step S38. In step S39, $Ix_{PA}$ and $Iy_{PA}$ are updated to correspond to the values of $Ix_{PA}$ and $Iy_{PA}$ that caused the state of the reference memory cell 160 to change.

After $Ix_{PA}$ and $Iy_{PA}$ have been updated, the reference memory cell 160 is in the antiparallel state. The values $Ix_{AP}$ and $Iy_{AP}$ can then be determined.

In step S40, initial values of $Ix_{AP}$ and $Iy_{AP}$ are applied at the reference memory cell 160. The state of the reference memory cell 160 is detected in step S42, and if the state is determined to be unchanged in step S44, the values $Ix_{AP}$ and $Iy_{AP}$ are increased by an incremental amount in step S46. $Ix_{AP}$ and $Iy_{AP}$ are increased iteratively until the state of the reference memory cell 160 changes under application of $Ix_{AP}$ and $Iy_{AP}$. When the state of the reference memory cell 160 changes, the values $Ix_{AP}$ and $Iy_{AP}$ that caused the state change are set as the updated $Ix_{AP}$ and $Iy_{AP}$ values in step 48.

After the $Ix_{PA}$, $Iy_{PA}$, $Ix_{AP}$, $Iy_{AP}$ values have been updated in step S14, the updated values can be stored and used by the current sources 702, 704, 800. An optional additional step may include increasing one or more of $Ix_{PA}$, $Iy_{PA}$ and $Iy_{AP}$ and $Iy_{AP}$ by a predetermined amount after updating in step S14. The predetermined amount can be added to $Iv_{PA}$, $Iy_{PA}$, $Ix_{AP}$ and $Iy_{AP}$, for example, to ensure switching of memory cells 130 by the updated current values.

Figure 7:
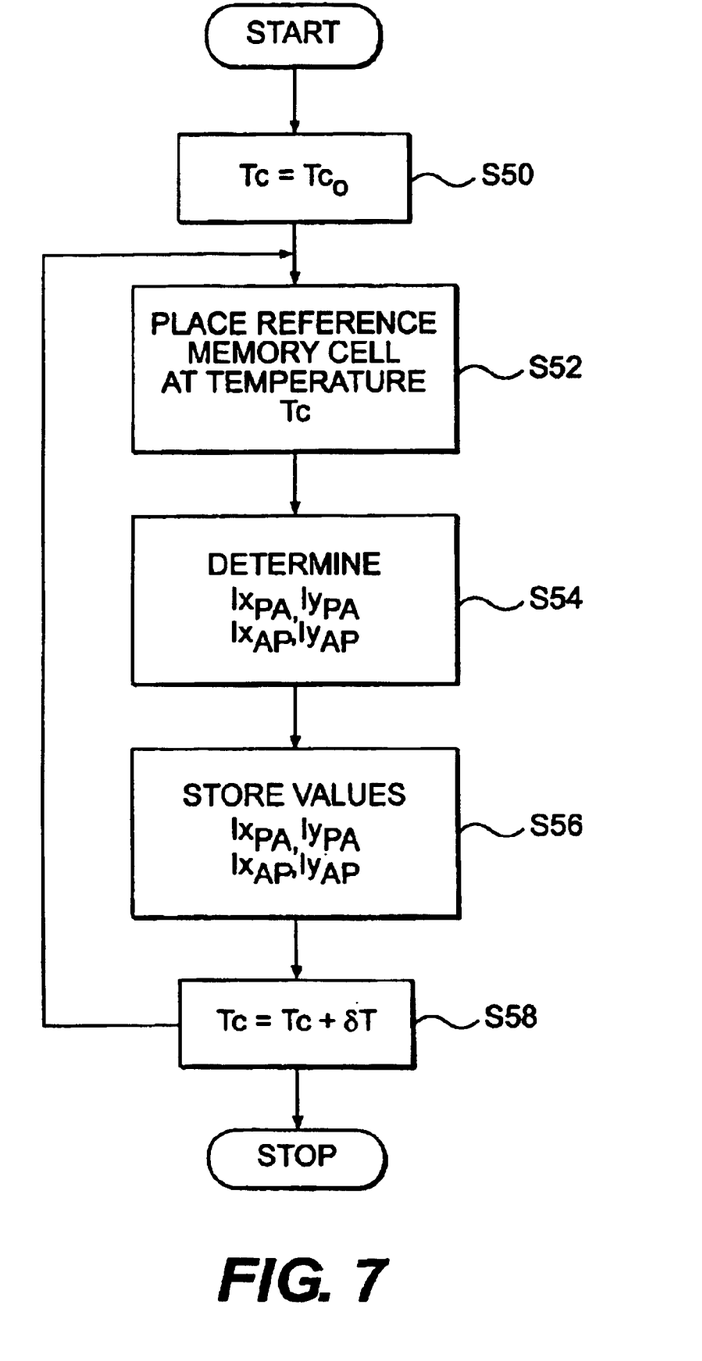
FIG. 7 is a flow chart illustrating a method of filling a lookup table.

FIG. 7 is a flow chart illustrating a method of filling a lookup table according to one embodiment. The lookup table values of $Ix_{PA}$, $Iy_{PA}$, $Ix_{AP}$, $Iy_{AP}$ can be stored, and accessed in step S14 of the method illustrated in FIG. 5.

In step S50, a calibration temperature variable Tc is set at an initial value $Tc_0$. The initial temperature value $Tc_0$ can, for example, be at the lower end of an expected operating temperature range for the memory array 100. In step S52, the reference memory cell 160 is placed at the temperature Tc. The reference memory cell 160 can be placed at the calibration temperature Tc by appropriate heating or cooling of the memory array 100.

In step S54, values $Ix_{PA}$, $Iy_{PA}$, $Ix_{AP}$, $Iy_{AP}$ for the present calibration temperature Tc are determined using the reference memory cell 160. The values can be determined, for example, using steps S30 through S48, as illustrated in FIG. 6.

In step S56, the current values $Ix_{PA}$, $Iy_{PA}$, $Ix_{AP}$, $Iy_{AP}$ are stored. The values can be stored in any media accessible by the controller 52, including a media comprising a part of the controller 52, so that the current sources 702, 704, 800 can be instructed to generate the currents. The values for $Ix_{PA}$, $Iy_{PA}$, $Ix_{AP}$, $Iv_{AP}$ are associated with the present calibration temperature Tc.

In step S58, the calibration temperature Tc is increased by an incremental amount $\delta T$. The amount $\delta T$ can be as small as necessary to obtain a desired degree of precision for the calibration process. The method then returns to step S52, where the temperature of the memory array 100 is raised to the new calibration temperature Tc, and values for $Ix_{PA}$, $Iy_{PA}$, $Ix_{AP}$, $Iy_{AP}$ are determined for the new calibration temperature Tc in step S54.

The process of determining $Ix_{PA}$, $Iy_{PA}$, $Ix_{AP}$, $Iy_{AP}$ for each value Tc is repeated until Tc reaches a value corresponding to an upper end of the expected operating temperature range for the memory array 100.

After $Ix_{PA}$, $Iy_{PA}$, $Iy_{AP}$, $Iy_{AP}$ values have been generated for each calibration temperature value Tc, a complete lookup table of write current values for the memory array 100 has been generated. The lookup table, for example, is accessible in step S14 of the method illustrated in FIG. 5.

As an alternative to starting the calibration process at a lower end of an expected operating temperature range of the memory device 50, $Tc_0$ may instead be set at an upper end of the expected operating temperature range. In this case, Tc is decreased by $\delta T$ in step S58.

According to the methods illustrated in FIGS. 5–7, the memory device 50 can reliably switch the memory cells 130 of the memory array 100. Updating the write currents $Ix_{PA}$, $Iy_{PA}$, $Ix_{AP}$, $Iy_{AP}$ when temperature variations occur ensures that the appropriate switching fields Hx and Hy are applied when the temperature of the memory array 100 varies. In addition, by calculating separate values for parallel-to-antiparallel and antiparallel-to-parallel switching currents, the calibration method compensates for asymmetry in the switching curves for the memory cells 130.

Figure 8:
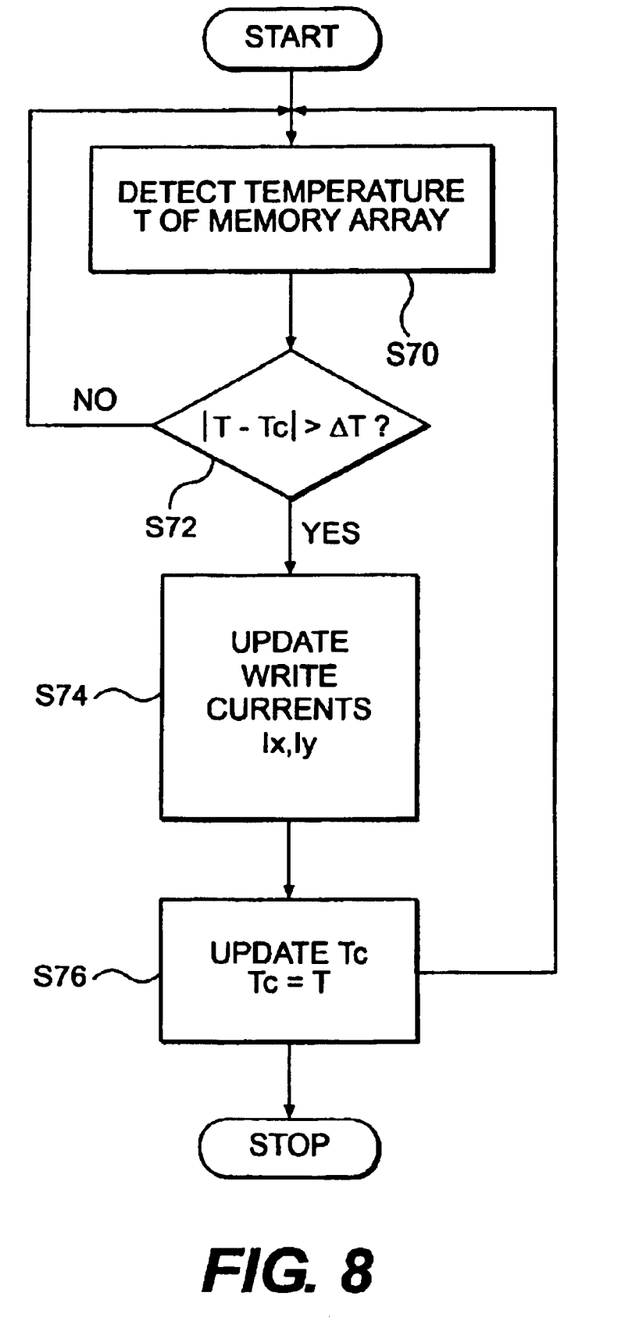
FIG. 8 is a flow chart illustrating an alternative method of calibrating a memory device.
Figure 9:
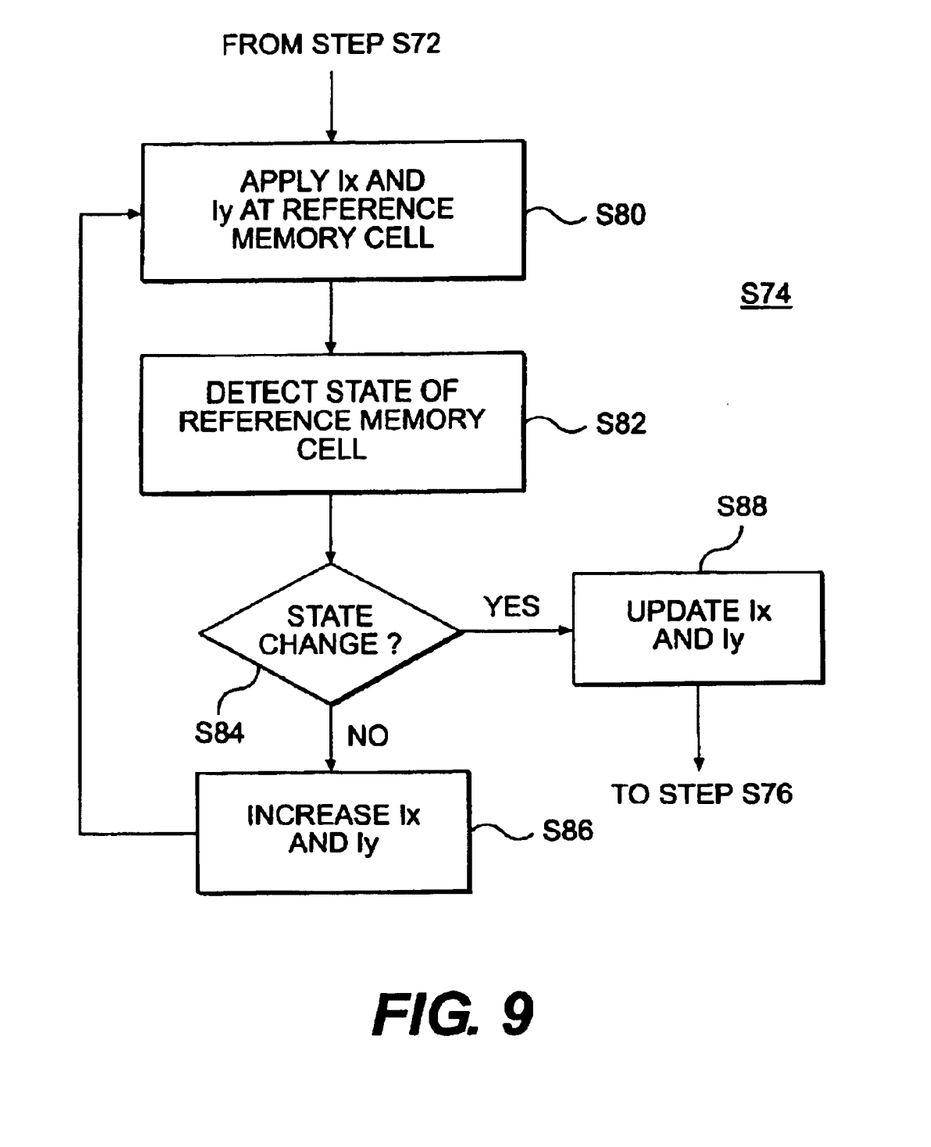
FIG. 9 is a flow chart illustrating a method of updating write currents according to the method illustrated in FIG. 8.

The methods discussed above address the situation where the antiparallel-to-parallel switching curve for a memory cell 130 may be asymmetric about the zero coercivity axis with respect to the parallel-to-antiparallel switching curve (see discussion of FIG. 4 above). FIG. 8 is a flow chart illustrating an alternative method of calibrating a memory device, in which a memory array 100 may include memory cells having antiparallel-to-parallel switching curves that are substantially symmetric about a zero coercivity axis with respect to the parallel-to-antiparallel switching curve. FIG. 9 is a flow chart illustrating a method of updating write currents according to the method illustrated in FIG. 8.

In step S70, a temperature T of the memory array 100 is detected by the temperature sensor 150. Temperature detection can be performed, for example, periodically.

In step S72, the temperature T of the memory array 100 is compared with a calibration temperature Tc to determine whether the difference between the temperature T of the memory array 100 and the calibration temperature Tc is greater than a threshold temperature change value $\Delta T$. If |T−Tc| does not exceed the threshold temperature change value $\Delta T$, the method returns to step S70. If |T−Tc| exceeds the threshold temperature change value $\Delta T$, the method proceeds to step S74.

In step S74, the write currents Ix and Iy are updated to compensate for coercivity changes in the memory cells 130 cased by the change in temperature T of the memory array 100. The write currents Ix and Iy can be updated, for example, according to the method illustrated in FIG. 9, in which data from the reference memory cell 160 is used to determine appropriate Ix and Iy values. The method illustrated in FIG. 9 is discussed in detail below. Alternatively, the appropriate Ix and Iy values for the detected temperature T can be selected from a lookup table.

After the Ix and Iy values are updated in step S74, the calibration temperature Tc is updated in step S76. The calibration temperature Tc can be assigned the value of the present temperature T of the memory array 100 detected in step S70. The method then returns to step S70, where the temperature of the memory array 100 may be periodically monitored. Alternatively, the method can STOP when operation of the memory device 50 ceases.

FIG. 9 is a flow chart illustrating a method of updating write currents according to the method illustrated in FIG. 8. The steps illustrated in FIG. 9 comprise step S74 from FIG. 8. The method illustrated in FIG. 9 utilizes data from the reference memory cell 160 to determine appropriate Ix and Iy values for the memory array 100 operating at a detected temper T. The method illustrated in FIG. 9 assumes that the reference memory cell 160 is in a parallel state when calibration begins. If the reference memory cell 160 is initially in an antiparallel state, −Iy, instead of Iy, would be applied to change the state of the reference memory cell 160.

In step S80, arbitrarily low initial currents of Ix and Iy are applied at the first and second conductors 161, 162 crossing at the reference memory cell 160. In step S82, the state of the reference memory cell 160 is detected. The output of the sense amplifier 600 can be used to determine the state of the reference memory cell 160.

In step S84, it is determined whether the currents Ix and Iy caused the reference memory cell 160 to switch from a parallel to an antiparallel state. If the state of the reference memory cell 160 has not changed, Ix and Iy are increased by an incremental amount in step S86. The method then returns to step S80, where the increased currents Ix and Iy are applied to the reference memory cell 160. The process of incrementally increasing Ix and Iy is repeated until the state of the reference memory cell 160 is changed under application of Ix and Iy in step S80. Then, at step S84, when a state change is detected, the method proceeds to step S88. In step S88, Ix and Iy are updated to correspond to the values of Ix and Iy that caused the state of the reference memory cell 160 to change.

As an alternative to calculating updated write currents Ix and Iy during the method illustrated in FIG. 8, Ix and Iy values can be taken from a lookup table. The Ix and Iy values can be calculated in a manner similar to the method illustrated in FIG. 7. However, it is not necessary to calculate parallel-to-antiparallel and antiparallel-to-parallel switching currents. In other words, a single state change, either from parallel-to-antiparallel, or from antiparallel-to-parallel, for each certain temperature T, can be used to fill the lookup table. The lookup table values of Ix and be can be stored, and accessed in step S74 of the method illustrated in FIG. 8.

The calibration methods discussed above can be performed by the controller 52, or by any computing device capable of executing instructions. For example, an external processing device could be coupled to the memory device 52 to perform the calibration methods discussed above.

In the calibration methods discussed above, calibration is performed using a reference memory cell 160. The reference memory cell 160 can be a memory cell separate from the array 100 of memory cells 130 that are used to store data in the memory device 50. Alternatively, a memory cell 130 in the memory array 100 can function as the reference memory cell in the methods discussed above. If a memory cell 130 is used as the reference memory cell, the current sources 702, 704, 800 can be used to apply the write currents used to calibrate the memory device 50. If a memory cell 130 in the memory array 100 is used as the reference memory cell, care should be taken to return the memory cell 130 to its state before calibration, so that the bit stored in the memory cell 130 is not erased during calibration.

The illustrated sense amplifier 600 in FIG. 3 is an example of a sensing device for detecting a binary state of a the memory cells 130 in the memory device 50. In practice, other sensing devices, such as a trans-impedance sense amplifier, a charge-injection sense amplifier, a differential sense amplifier, or a digital differential sense amplifier, for example, can be used. One sense amplifier 600 is illustrated in FIG. 3 for sensing the binary state of the memory cells 130. In practice, a greater number of sensing devices can be coupled to a memory array. For example, a sense amplifier can be included for each column conductor in a memory array.

The conventions for current flow to write states of 0 and 1 in the memory array are arbitrary, and can be reassigned to fit any desired application of the memory device 50.

The memory cells 130 used in the memory array 100 can be any type of memory cell responsive to write currents. In one embodiment, the memory cells 130 and the reference memory cell 160 are magnetic random access memory (MRAM) cells. Other cells are also appropriate for use in the memory array 100. For example, memory cells such as giant magnetoresistance (GMR) devices, magnetic tunnel junctions (MTJ), and other types of memory cells may be used in the memory array 100.

The memory device 50 can be used in a wide variety of applications. One application may be a computing device having an MRAM storage module. The MRAM storage module may include one or more MRAM memory arrays for long term storage.

MRAM storage modules can be used in devices such as, for example, laptop computers, personal computers, and servers.

A temperature compensated voltage source in accordance with the above embodiments could also be used in conjunction with a memory array.

While the memory device 50 is described with reference to exemplary embodiments, many modifications will be readily apparent to those skilled in the art, and the present disclosure is intended to cover variations thereof.

What is claimed is:

1. A method of calibrating a memory device, the memory device comprising an array of memory cells, a plurality of first conductors and a plurality of second conductors, the method comprising:

detecting a temperature of the memory device;

determining whether the temperature of the memory device has changed by at least a threshold value; and updating at least one write current value if the temperature of the memory device changed by at least the threshold value.

2. The method of claim 1, wherein the step of detecting a temperature of the memory device comprises:

periodically detecting a temperature of the memory device during operation of the memory device.

3. The method of claim 1, comprising:
updating a calibration temperature by assigning the calibration temperature a value at least substantially equal to the detected temperature if the temperature of the memory device changes by at least the threshold value.

4. The method of claim 1, wherein the step of updating at least one write current value comprises:
applying a first write current and a second write current to conductors crossing at a reference memory cell.

5. The method of claim 4, wherein the step of updating at least one write current value comprises:
detecting whether a state of the reference memory cell changes.

6. The method of claim 5, wherein the step of updating at least one write current value comprises:
updating the at least one write current value according to the first write current and the second write current if the state of the reference memory cell changes.

7. The method of claim 5, wherein the step of updating at least one write current value comprises:
increasing the first write current and the second write current if the state of the reference memory cell does not change.

8. The method of claim 1, wherein the step of updating at least one write current value comprises:
- a. applying a first write current and a second write current to conductors crossing at a reference memory cell;
- b. detecting a state of the reference memory cell;
- c. increasing the first write current and the second write current if the state of the reference memory cell does not change;
- d. repeating steps a–c until the state of the reference memory cell changes from a first state to a second state; and
- e. updating the at least one write current value according to the first write current and the second write current when the state of the reference memory cell changes.

9. The method of claim 8, wherein the step of updating at least one write current value comprises:
- f. applying a third write current and a fourth write current to the conductors crossing at the reference memory cell;
- g. detecting a state of the reference memory cell;
- h. increasing the third write current and the fourth write current if the state of the reference memory cell does not change;
- d. repeating steps f–h until the state of the reference memory cell changes from the second state to the first state; and
- e. updating the at least one write current value according to the third write current and the fourth write current when the state of the reference memory cell changes.

10. The method of claim 1, wherein the step of detecting a temperature of the memory device comprises:
detecting a temperature of the array of memory cells.

11. The method of claim 1, wherein the wherein the step of updating at least one write current value comprises:
accessing at least one stored write current value associated with the detected temperature.

12. A method of filling a table with write current values for use in calibrating a memory device, wherein the write current values are associated with temperature values, the memory device comprising an array of memory cells, a plurality of first conductors and a plurality of second conductors, the method comprising:
- a. applying a first write current and a second write current to conductors crossing at a reference memory cell when the memory array is at a temperature;
- b. detecting a state of the reference memory cell;
- c. increasing the first write current and the second write current if the state of the reference memory cell does not change;
- d. repeating steps a–c until the state of the reference memory cell changes from a first state to a second state; and
- e. storing the first write current value and the second write current value that cause the state of the reference memory cell to change, wherein the first and second write current values are associated with the temperature.

13. The method of claim 12, comprising:
- f. changing the temperature of the array;
- g. repeating steps a–c until the state of the reference memory cell changes from a first state to a second state; and
- h. storing the first write current value and the second write current value that cause the state of the reference memory cell to change, wherein the first and second write current values are associated with the temperature.

14. The method of claim 12, comprising:
- i. applying a third write current and a fourth write current to conductors crossing at the reference memory cell when the memory array is at a temperature;
- j. detecting a state of the reference memory cell;
- k. increasing the third write current and the fourth write current if the state of the reference memory cell does not change;
- l. repeating steps i–k until the state of the reference memory cell changes from the second state to the first state; and
- m. storing the third write current value and the fourth write current value that cause the state of the reference memory cell to change, wherein the third and fourth current values are associated with the temperature.

* * * * *